(12) United States Patent
Suwa et al.

(10) Patent No.: US 6,772,515 B2
(45) Date of Patent: Aug. 10, 2004

(54) METHOD OF PRODUCING MULTILAYER PRINTED WIRING BOARD

(75) Inventors: Tokihito Suwa, Hitachi (JP); Atsushi Tanaka, Ibaraki (JP); Satoshi Tanigawa, Ibaraki (JP); Hirofumi Fujii, Ibaraki (JP); Kazunori Mune, Ibaraki (JP)

(73) Assignees: Hitachi, Ltd., Tokyo (JP); Nitto Denko Corporation, Osaka (JP)

( * ) Notice: Subject to any disclaimer, the term of this patent is extended or adjusted under 35 U.S.C. 154(b) by 165 days.

(21) Appl. No.: 09/960,919

(22) Filed: Sep. 25, 2001

(65) Prior Publication Data

US 2002/0056192 A1 May 16, 2002

(30) Foreign Application Priority Data

Sep. 27, 2000 (JP) ........................................ 2000-293895

(51) Int. Cl.$^7$ ................................................ H05K 3/02
(52) U.S. Cl. .............................. 29/847; 29/825; 29/830; 29/846; 29/852
(58) Field of Search ......................... 29/847, 846, 830, 29/852, 825; 427/97; 216/17, 18, 20

(56) References Cited

U.S. PATENT DOCUMENTS

| | | | |
|---|---|---|---|
| 3,352,730 A | | 11/1967 | Murch, Jr. et al. ............... 156/3 |
| 5,153,986 A | * | 10/1992 | Brauer et al. |
| 5,153,987 A | * | 10/1992 | Takahashi et al. |
| 5,436,062 A | * | 7/1995 | Schmidt et al. |
| 5,495,665 A | | 3/1996 | Carpenter et al. ............ 29/830 |
| 5,690,837 A | * | 11/1997 | Nakano et al. |
| 5,729,897 A | * | 3/1998 | Schmidt et al. |

FOREIGN PATENT DOCUMENTS

| | | |
|---|---|---|
| GB | 1379558 A | 1/1975 |
| WO | 00/46877 A2 | 8/2000 |

OTHER PUBLICATIONS

Patent Abstract of Japan, Publication No. 05291727, Publication Date Nov. 5, 1993.
Patent Abstract of Japan, Publication No. 06132630, Publication Date May 13, 1994.
Patent Abstract of Japan, Publication No. 07273466, Publication Date Oct. 20, 1995.
Patent Abstract of Japan, Publication No. 09186454, Publication Date Jul. 15, 1997.

* cited by examiner

*Primary Examiner*—Carl J. Arbes
(74) *Attorney, Agent, or Firm*—Kubovcik & Kubovcik

(57) ABSTRACT

To provide a method of producing a multilayer printed wiring board that can be intended to have low-profile, light-weight and high-density wiring of a printed wiring board, and a multilayer printed wiring board produced by the method of producing a multilayer printed wiring board, the double-sided substrate is produced by the steps of forming an insulating resin layer on a metal foil; of forming a via hole in the insulating resin layer; of forming a first circuit pattern on the insulating resin layer and forming a conductive layer in the via hole, by plating; and of etching the metal foil to form it into a second circuit pattern. The produced double-sided substrate is used as a core substrate for producing multilayer printed wiring board by a laminate-en-bloc or a build-up method.

3 Claims, 9 Drawing Sheets

METHOD OF PRODUCING MULTILAYER PRINTED WIRING BOARD

BACKGROUND OF THE INVENTION

1. Field of the Invention

The present invention relates to a method of producing a multilayer printed wiring board and to a multilayer printed wiring board produced by the method of producing a multilayer printed wiring board.

2. Description of Background Art

In general, methods of producing a multilayer printed wiring board are roughly classified into two typical methods. One is a laminate-en-bloc method in which a plurality of double-sided substrates, as core substrates, each having a specified circuit pattern formed on each side are laminated and adhesive bonded en bloc through prepreg. Another is a build-up method in which a specified circuit pattern and an insulating resin layer are formed one after another.

In the laminate-en-bloc method, a substrate formed by laminating copper foil to cloth or non-woven fabric made of glass or aramide impregnated with epoxy resin or phenol resin, i.e., a copper clad laminate, is used as a core substrate. Through holes are formed in the copper clad laminate by drilling or laser, first, and then are made to be electrically conductive by copper-plating. Thereafter, the copper foil is formed into a specified circuit pattern by etching, to thereby produce a double-sided substrate. Sequentially, two or more double-sided substrates thus produced are laminated and adhesive bonded to each other through prepreg to thereby produce a multilayer printed wiring board.

On the other hand, in the build-up method, a copper clad laminate having a specified circuit pattern formed thereon or a multilayer printed wiring board produced by the laminate-en-bloc method is used as the core substrate. Insulating resin is coated on the core substrate, first, and, then, via holes for interconnecting layers are formed by a photo lithography or laser. Then, copper plating is performed to form a specified circuit pattern and also make the via holes be electrically conductive. Thus, the specified circuit pattern and the insulating resin layer are alternately formed by alternating the insulating resin coating step and the copper plating step, whereby a multilayer printed wiring board is produced.

Along with rapid progress of popularization of mobile phones and personal digital assistances, the low-profile, light-weight and high-density wiring for the printed wiring board is being increasingly demanded.

In the laminate-en-bloc method, since the core substrate used is formed with a cloth or non-woven fabric, it is hard to reduce thickness and weight of the printed wiring board and diameter of the through holes for a high-dense wiring.

On the other hand, in the build-up method, since the cloth or non-woven fabric is not present in the insulating resin layer, the insulating resin layer can be reduced in thickness and via holes can be reduced in diameter. The build-up method has some advantage over the laminate-en-bloc method in the intended purpose of providing a low-profile, light-weight and high-density wiring of a printed wiring board. However, in the build-up method as well, it is still hard to provide a low-profile, light-weight and high-density wiring of the core substrate.

It is the object of the present invention to provide a method of producing a multilayer printed wiring board that can be intended to have low-profile, light-weight and high-density wiring of a printed wiring board, and a multilayer printed wiring board produced by the method of producing a multilayer printed wiring board.

SUMMARY OF THE INVENTION

The present invention provides a novel method of producing a multilayer printed wiring board comprising a step of forming an insulating resin layer on a metal foil; a step of forming a via hole in the insulating resin layer; a step of forming a specified circuit pattern on the insulating resin layer and forming a conductive layer in the via hole, by plating; and a step of etching the metal foil to form it into the specified circuit pattern.

When the double-sided substrate produced by this method is used as a core substrate in lamination by the laminate-en-bloc method or by the build-up method, a multilayer printed wiring board intended to have a low-profile, light-weight and high-density wiring of the printed wiring board can be produced.

In the method of producing a multilayer printed wiring board according to the present invention, it is preferable that the metal foil is made of any of copper or copper alloy containing copper as its primary component, nickel or nickel alloy containing nickel as its primary component, alloy containing nickel and iron as its primary components and stainless steel. Also, it is preferable that the insulating resin layer comprises polyimide.

Further, the present invention includes a multilayer printed wiring board produced in a method of producing a multilayer printed wiring board comprising a step of forming an insulating resin layer on a metal foil; a step of forming a via hole in the insulating resin layer; a step of forming a specified circuit pattern on the insulating resin layer and forming a conductive layer in the via hole, by plating; and a step of etching the metal foil to form it into the specified circuit pattern.

This multilayer printed wiring board can be intended to have a low-profile, light-weight and high-density wiring of a printed wiring board as has been increasingly demanded in recent years.

Figure 2:
Figure 2:
Figure 2:
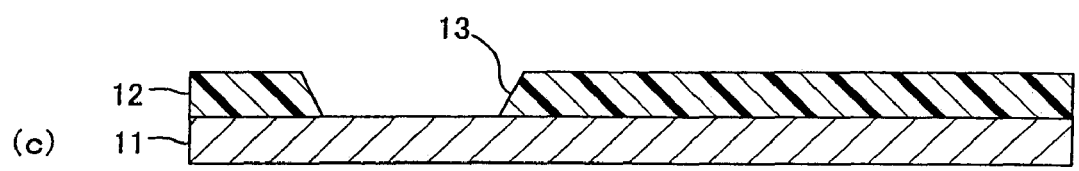
Figure 2:
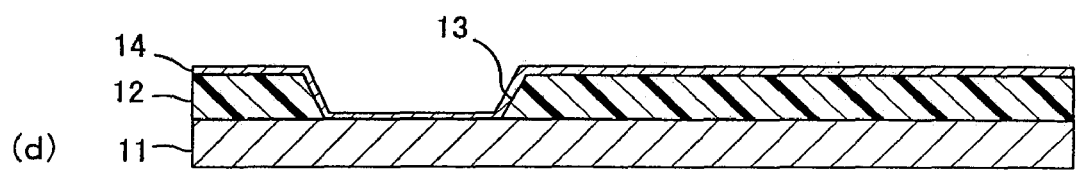
Figure 2:
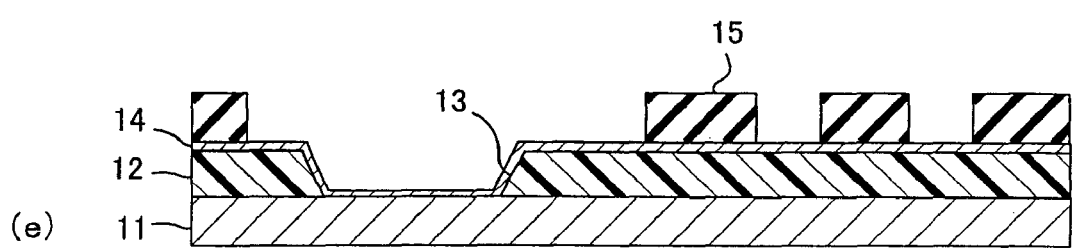
Figure 3:
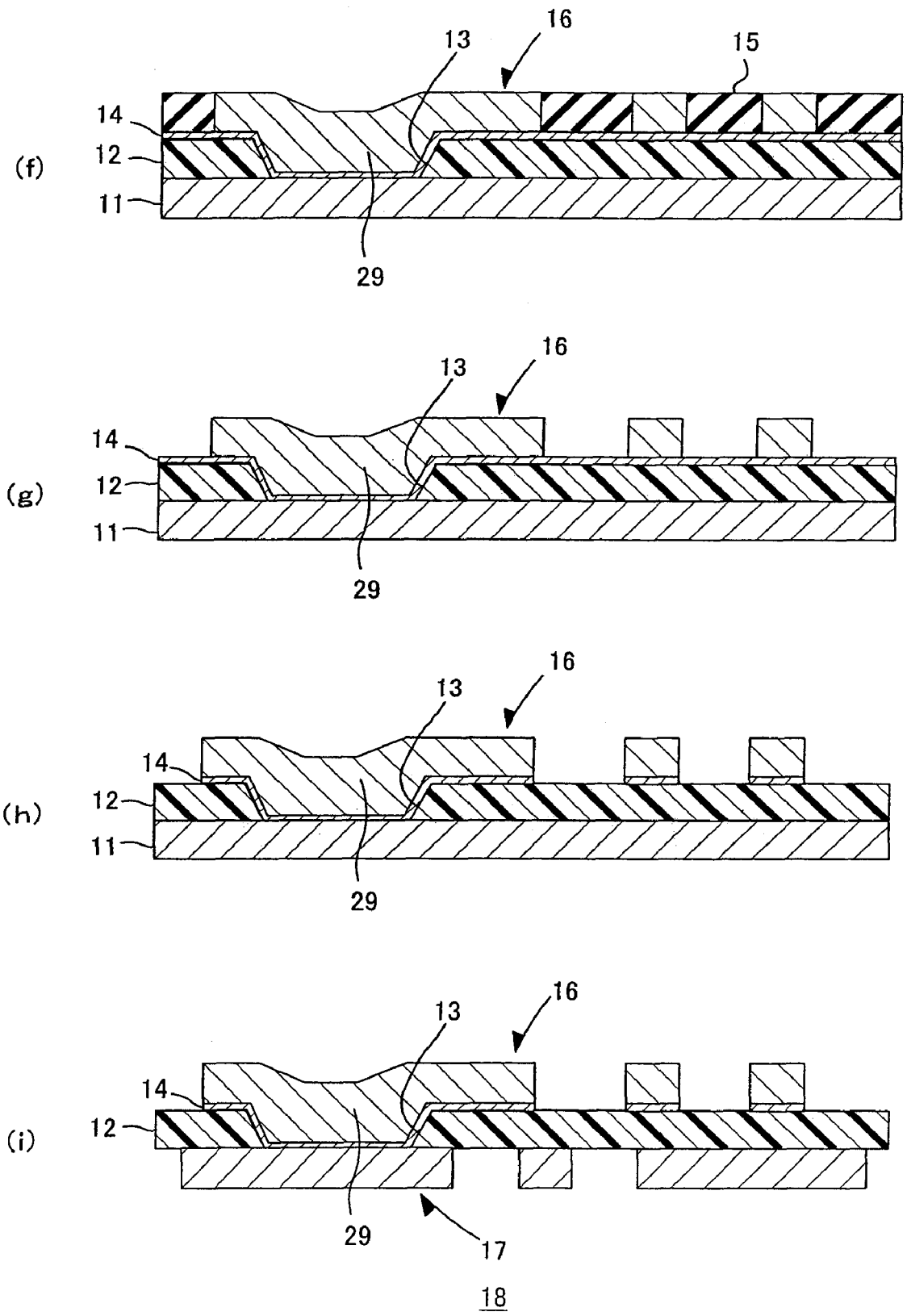
Figure 4:
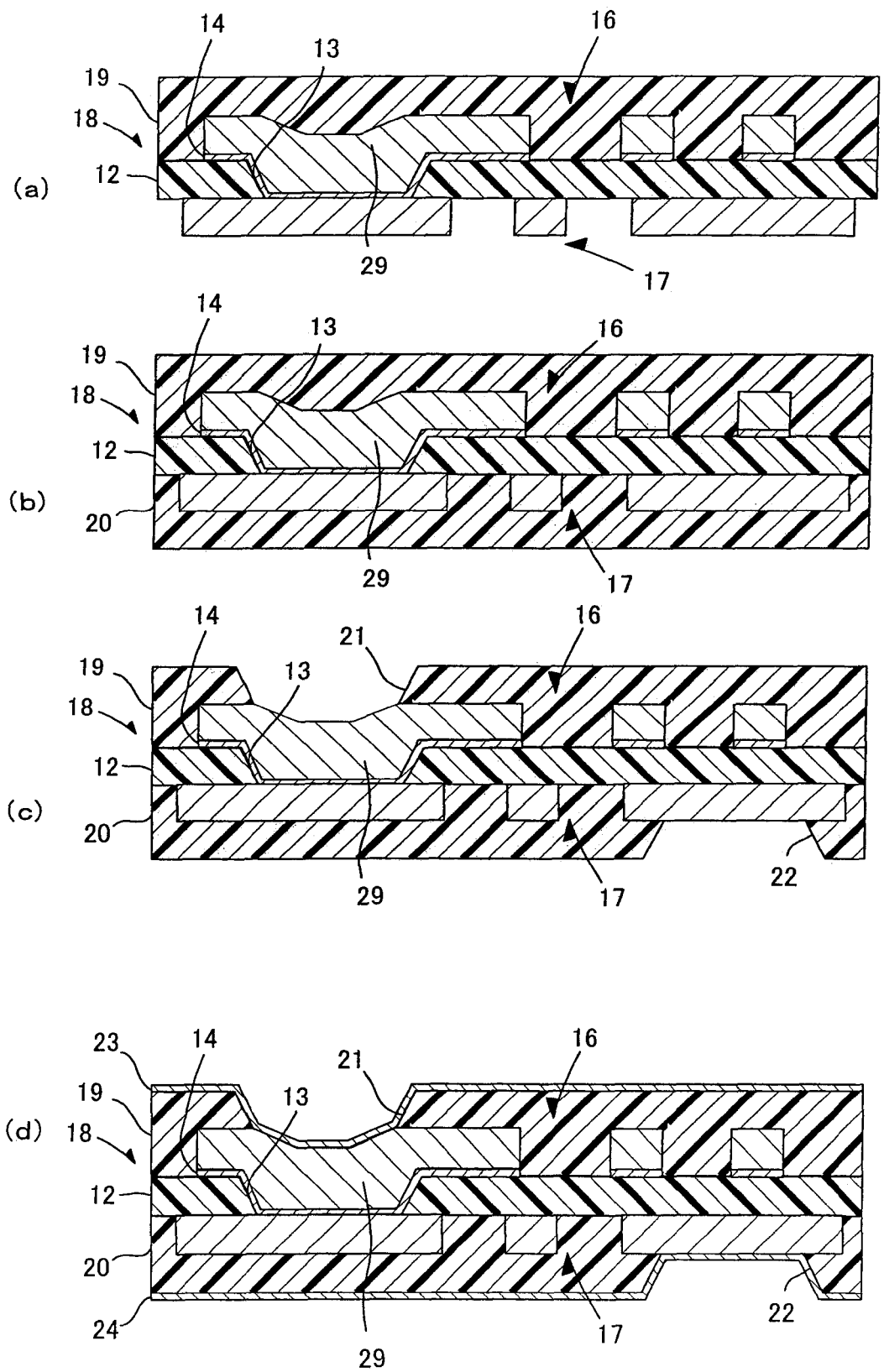
Figure 5:
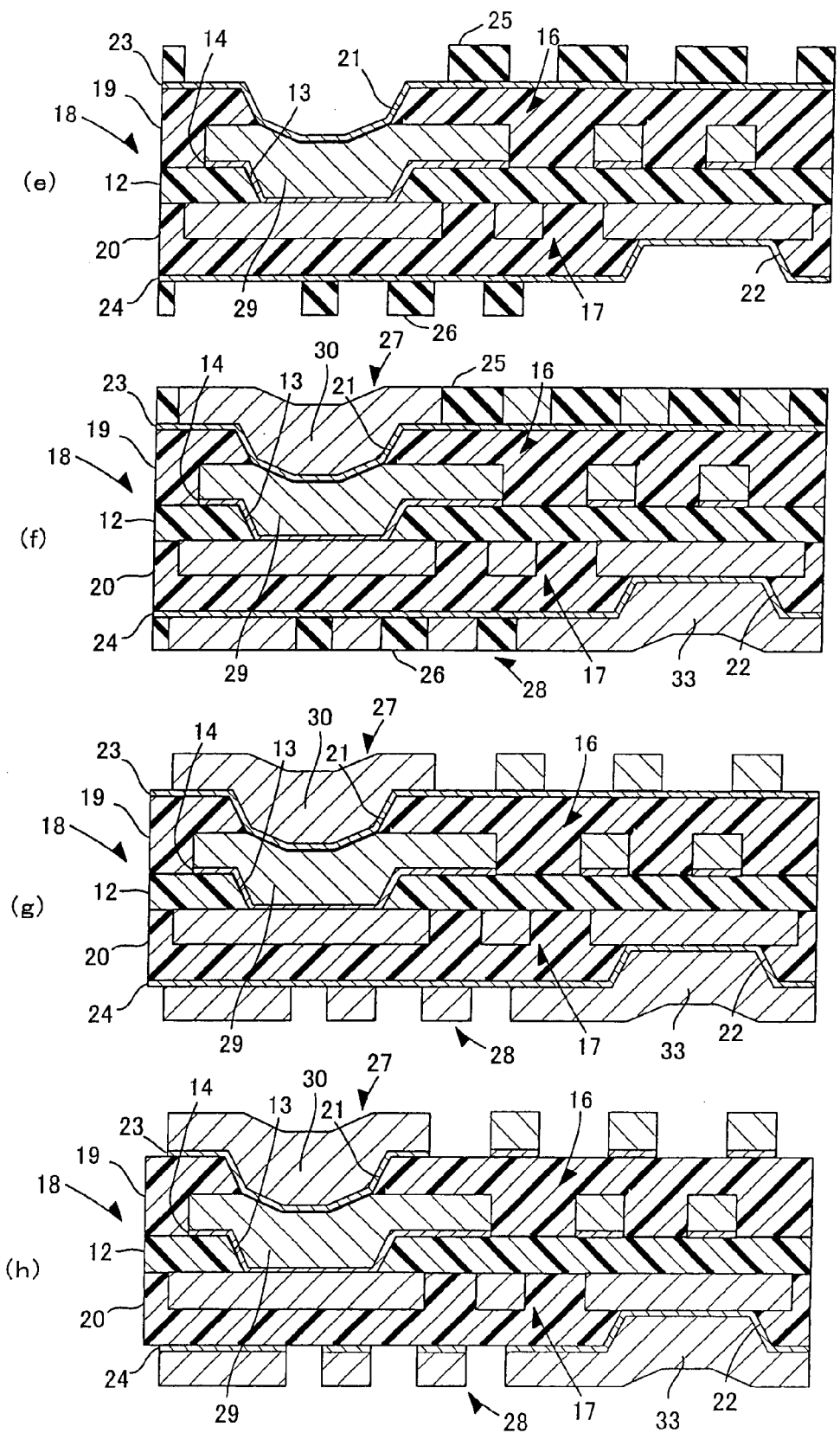
Figure 6:
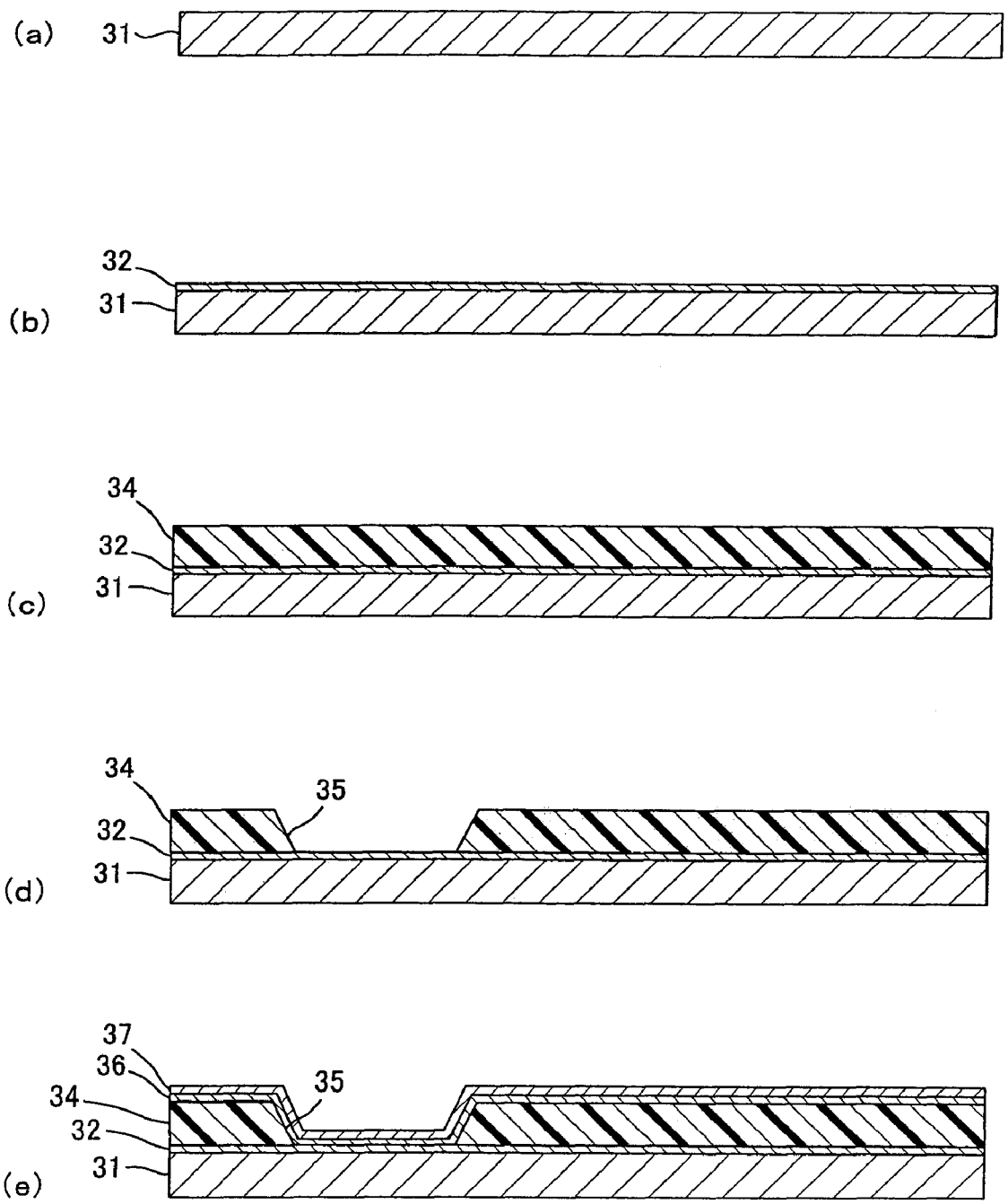
Figure 7:
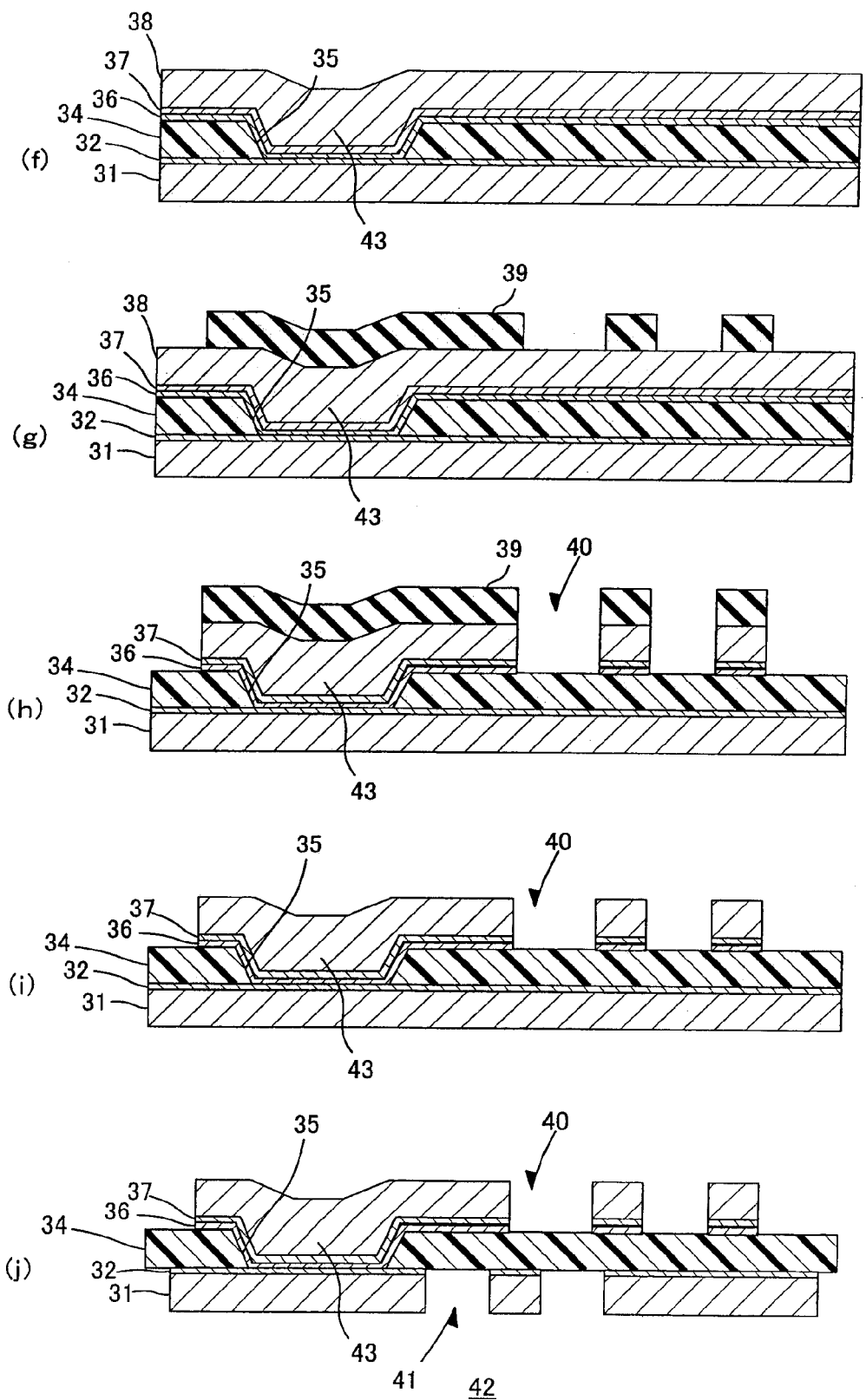
Figure 8:
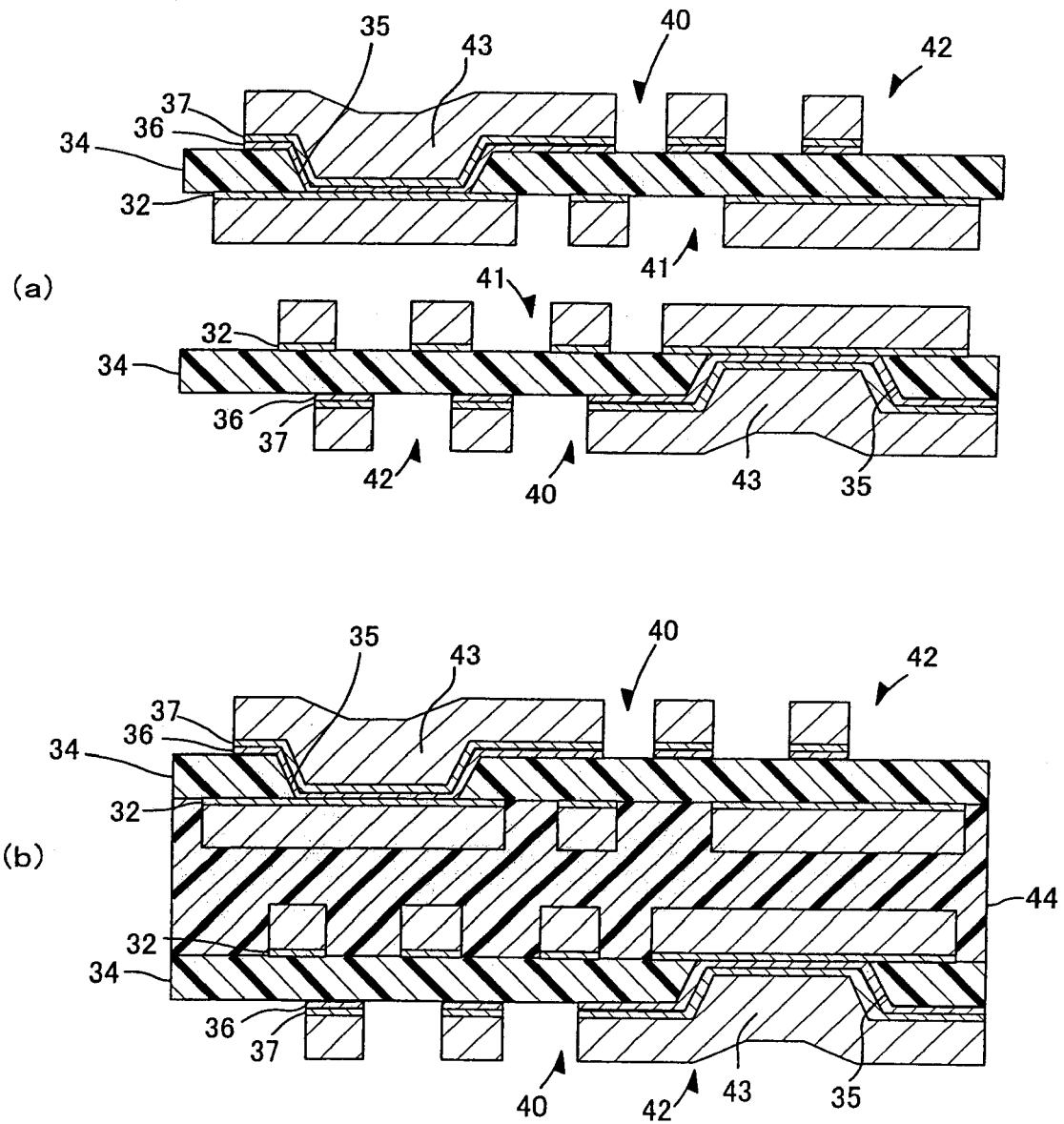
Figure 9:
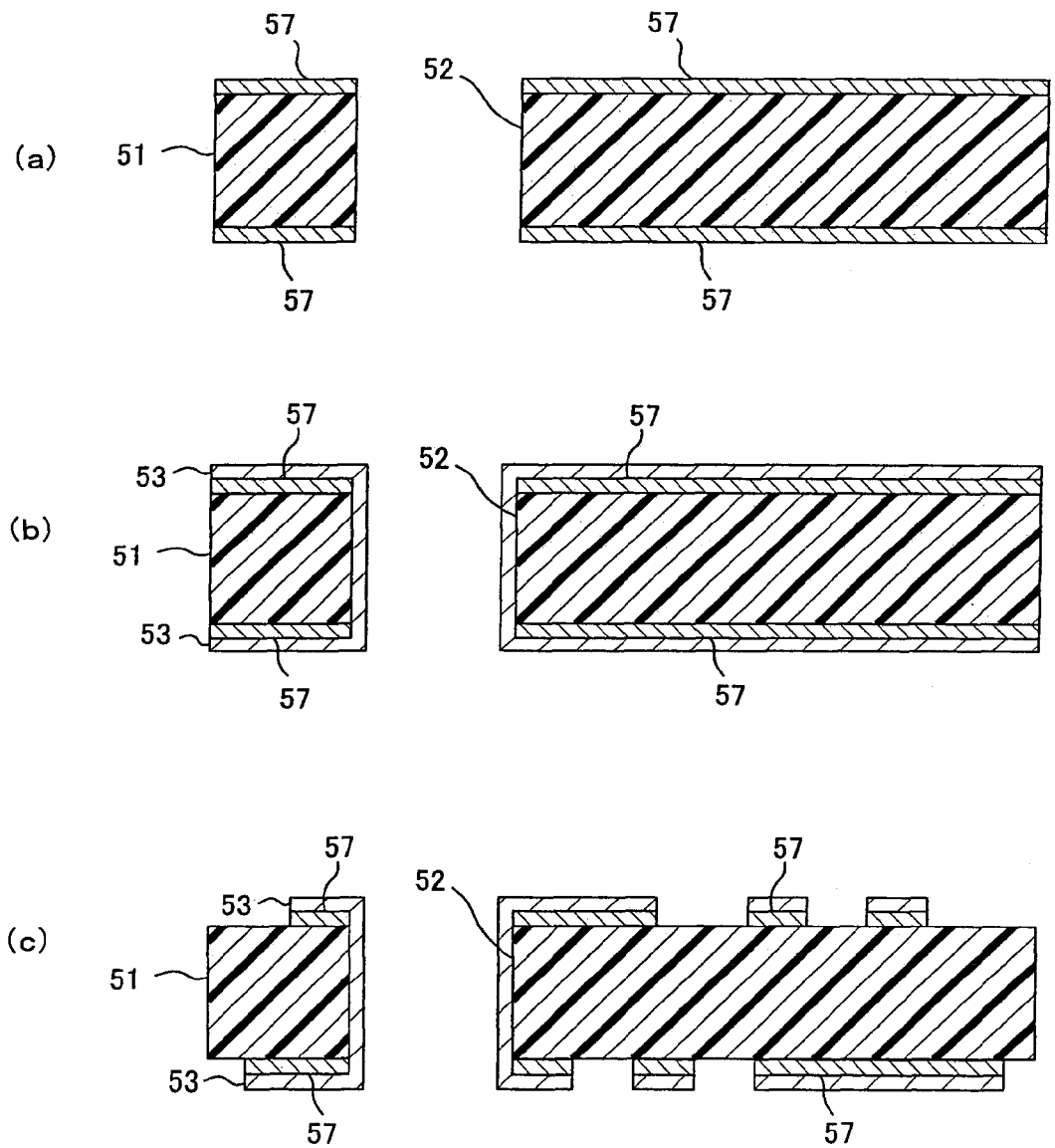

(a) the step of preparing a metal foil;

(b) the step of forming an insulating resin layer on the metal foil;

(c) the step of forming via holes in the insulating resin layer;

(d) the step of forming a first circuit pattern on the insulating resin layer and forming a conductive layer in the via holes by plating; and (e) the step of etching the metal foil, FIG. 2 shows sectional views of relevant parts of the steps of a method of producing a double-sided substrate in Example 1, illustrating:

(a) the step of preparing a nickel foil;

(b) the step of forming an insulating resin layer on the nickel foil;

(c) the step of forming via holes in the insulating resin layer;

(d) the step of forming a nickel plated layer on a front surface of the insulating resin layer and an exposed surface of the nickel foil; and (e) the step of laminating a dry film resist on a front surface of the nickel plated layer, FIG. 3 shows sectional views of relevant parts of the subsequent steps to those of FIG. 2 of the method of producing the double-sided substrate in Example 1, illustrating:
(f) the step of forming a first circuit pattern;
(g) the step of peeling off the dry film resist;
(h) the step of removing the nickel plated layer; and
(i) the step of forming a second circuit pattern, FIG. 4 shows sectional views of relevant parts of the steps of the method of producing a four-layer printed wiring board in Example 1, illustrating:
(a) the step of forming an insulating resin layer on the first circuit pattern;
(b) the step of forming an insulating resin layer on the second circuit pattern;
(c) the step of forming via holes in each of the insulating resin layers; and
(d) the step of forming nickel plated layers on a front surface of each of the insulating resin layers and exposed surfaces of each of the first circuit pattern and the second circuit pattern, FIG. 5 shows sectional views of relevant parts of the subsequent steps to those of FIG. 4 of the method of producing the four-layer printed wiring board in Example 1, illustrating:
(e) the step of laminating dry film resists on front surfaces of the nickel plated layers;
(f) the step of forming a third circuit pattern and a fourth circuit pattern;
(g) the step of peeling off the dry film resists; and
(h) the step of removing the nickel plated layers, FIG. 6 shows sectional views of relevant parts of the steps of a method of producing a double-sided substrate in Example 2, illustrating:
(a) the step of preparing a copper alloy foil;
(b) the step of forming a nickel plated layer on a single side of the copper alloy foil;
(c) the step of forming an insulating resin layer on a front surface of the nickel plated layer;
(d) the step of forming via holes in the insulating resin layer; and
(e) the step of forming a chrome sputter layer and a copper sputter layer on a front surface of the insulating layer and an exposed surface of the copper alloy foil, FIG. 7 shows sectional views of relevant parts of the subsequent steps to those of FIG. 6 of the method of producing the double-sided substrate in Example 2, illustrating:
(f) the step of forming a copper plated layer;
(g) the step of laminating a dry film resist on the copper plated layer;
(h) the step of forming a first circuit pattern;
(i) the step of peeling off the dry film resist; and
(j) the step of forming a second circuit pattern, FIG. 8 shows sectional views of relevant parts of the steps of the method of producing a four-layer printed wiring board in Example 2, illustrating:
(a) the step of preparing two double-sided substrates; and
(b) the step of laminating and bonding the two double-sided substrates to each other via polyimide resin adhesive sandwiched therebetween, FIG. 9 shows sectional views of relevant parts of the steps of producing a double-sided substrate in Comparative Example 1, illustrating:
(a) the step of forming through holes in a glass-epoxy laminated substrate;
(b) the step of forming a copper plated layer on inner walls of the through holes and a front surface of the glass-epoxy laminated substrate; and
(c) the step of forming the circuit patterns on both sides of the substrate, respectively.

DETAILED DESCRIPTION OF PREFERRED EMBODIMENTS

Figure 1:
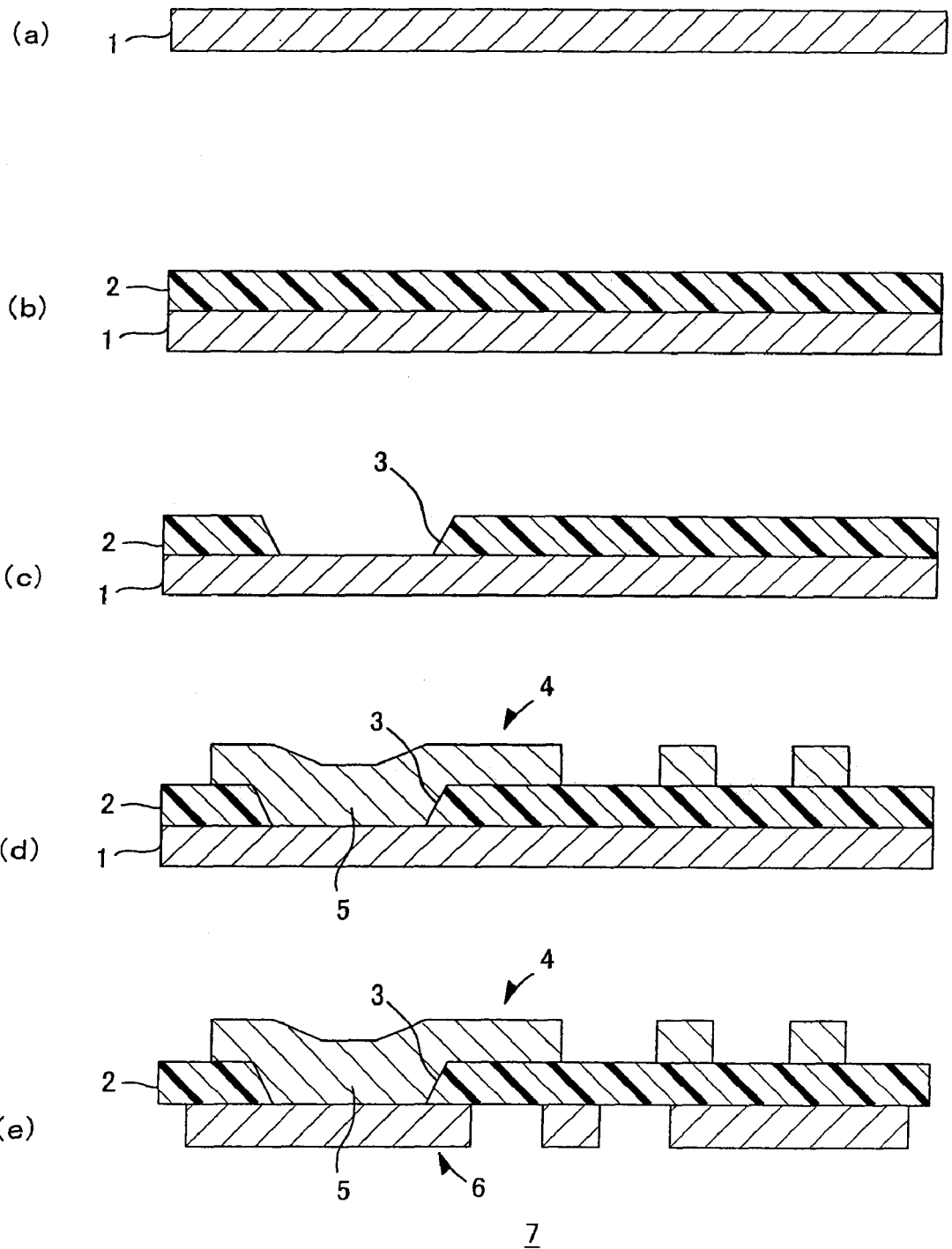
FIG. 1 shows sectional views of relevant parts of the steps of a method of producing a multilayer printed wiring board of the present invention, illustrating.

In the method of producing a multilayer printed wiring board of the present invention, an insulating resin layer is formed on a metal foil, first. For forming the insulating resin layer on the metal foil, as shown in FIG. 1(a), a metal foil 1 is prepared and then the front surface of the metal foil 1 is degreased and is roughened, as required.

Any metals having good electrical conducting properties may be used as the metal foil 1. For example, copper or copper alloy containing copper as its primary component, nickel or nickel alloy containing nickel as its primary component, aluminum or aluminum alloy containing aluminum as its primary component and alloy containing nickel and iron as its primary components may preferably be used. For the alloy containing nickel and iron as its primary components, a total of more than 90 weight % of nickel and iron is preferably contained in the whole alloy and further 20–90 weight %, or preferably 36—85 weight % of nickel is preferably contained in the whole alloy.

Those having a nickel content of 85 weight %, 78 weight %, 45 weight %, 42 weight % and 36 weight % are commercially available as the alloy containing nickel and iron as its primary components.

For the purpose of providing an increased bending strength of a finished multilayer printed wiring board, for example a stainless steel having elasticity can be used.

It is enough for the metal foil 1 to have thickness of a few $\mu$m or more at least. If a higher bending strength is required, then the metal foil 1 having thickness of more than 100 $\mu$m may be used, depending on the number of metal foils used for forming the multilayer printed wiring board.

The metal foil 1 may be degreased with any known acidic or alkaline degreasing agent, for example, by heating at temperature ranging from room temperature to 60° C. for a few minutes, unless the metal foil 1 is made of aluminum or aluminum alloy. Examples of the degreasing agents used are Metaclea CL-5513 (available from Dai-ichi Kogyo Seiyaku Co., Ltd.) and OPC Acid-clean 115 (available from Okuno Chemical Industries Co., Ltd.). For the metal foil 1 made of aluminum or aluminum alloy, the degreasing agents ranging from acid to weak alkali should preferably be used. An example of those degreasing agents is Toparclean 161 (available from Okuno Chemical Industries Co., Ltd.).

The metal foil 1 is roughened for the purpose of improving adhesiveness between the metal foil 1 and the insulating resin sequentially formed on the metal foil 1. Commercially available surface roughening agents may be used for the surface roughening of the metal foil 1. For example, for the metal foil 1 made of copper or copper alloy, CZ-8100 (available from Mec. Co., Ltd.) and OPC-400 (available from Okuno Chemical Industries Co., Ltd.) can be used as the surface roughening agent. The surface roughening of the metal foil 1 may be omitted when the insulating resin used has adequate adhesion properties to the metal foil 1.

Then, as shown in FIG. 1(b), an insulating resin layer 2 is formed on the single side of the metal foil 1 thus degreased and roughened, as required, by use of insulating resin.

The insulating resins that may be used include generally available build-up insulating resins. Either of wet resin form (liquid form) and dry film form can be used as the insulating resin. For example, the insulating resin layer 2 may be formed on the metal foil 1 by applying the insulating resin of liquid form to the single side of the metal foil 1 or by laminating the insulating resin of dry film form on the single side of the metal foil 1.

An example of the insulating resins of liquid form is BL-9700 (available from Hitachi Chemical Co., Ltd.) and an example of the insulating resins of dry film form is BF-8500 (available from Hitachi Chemical Co., Ltd.). No particular limitation is imposed on the primary component of the insulating resins. For example, epoxy, phenol, polyimide and BT resin can be used as the primary component of the insulating resins. For providing the multilayer printed wiring board with flexibility, polyimide is preferably used.

When polyimide is used as the primary component of the insulating resin, e.g. Kapton (available from Du Pont-Toray Co., Ltd.), UPILEX (available from Ube Industries, Ltd.) or a like insulating resin may be laminated on the single side of the metal foil 1 through adhesive such as SPB-050A (available from Nippon Steel Chemical Co., Ltd.), to form the insulating layer 2. Alternatively, polyamic acid solution is applied to the single side of the metal foil 1 and then is cured by heating, to form the insulating resin layer 2 of polyimide.

The insulating resin layer 2 thus formed is required to have thickness enough to ensure the interlayer insulation reliability. The thickness of the insulating resin layer 2 can selectively be determined in the range of e.g. a few $\mu$m to some tens $\mu$m.

Then, as shown in FIG. 1(c), via holes 3 are formed in the insulating resin layer 2 and, if necessary, the front surface of the insulating resin layer 2 is roughened. The via holes 3 are formed to electrically connect between the layers. The via holes 3 are formed in the insulating resin layer 2 in a laser method generally used in the build-up method. When the insulating resin layer 2 is formed with photosensitive resin, the via holes 3 can be formed by the photo lithography to subject the photosensitive resin to exposure and development.

The surface roughening of the insulating resin layer 2 can be provided by using a commercially available desmear agent containing permanganate as the primary component, depending on a kind of the insulating resin layer 2 used.

Then, as shown in FIG. 1(d), the first circuit pattern 4 is formed on the insulating resin layer 2 and conductive layers 5 are formed in the via holes 3, both of which are formed by plating. The method for forming the first circuit pattern 4 on the insulating resin layer 2 is not limited to any particular method. Known circuit-pattern forming methods, such as a subtractive method, a semi-additive method and a full-additive method, may be used for forming a specified circuit pattern. At the same time that this circuit pattern is formed, the conductive layers 5 are formed in the via holes 3 by plating, to allow the metal foil 1 and the first circuit pattern 4 to be electrically conductive through the conductive layers 5.

Either of electrolysis plating and electroless plating may be used for forming the circuit pattern 4 and the conductive layer 5. Though there is not any particular limitation on the primary component of the plating, the copper is preferably used. When the first circuit pattern 4 and the conductive layer 5 are formed by the electrolysis copper plating, a via filling additive and the like should preferably be added, for facilitation of filling of the plating into the via holes 3.

The thickness of the first circuit pattern 4 thus formed can selectively be determined in the range of e.g. a few $\mu$m to some tens $\mu$m.

Then, the metal foil 1 is etched to form the second circuit pattern 6, as shown in FIG. 1(e), whereby the double-sided substrate 7 is produced. The metal foil 1 is etched in the following process, for example. A dry film resist is formed on the front surface of the metal foil 1 in the same pattern as the second circuit pattern 6, first, and, then, the metal foil 1 is etched. Thereafter, the dry film resist is peeled off.

The double-sided substrate 7 thus produced has the structure wherein the first circuit pattern 4 and the second circuit pattern 6 are electrically connected to each other through the conductive layers 5. With this double-sided substrate 7 as the core substrate, a printed wiring(s) is/are layered thereon through an adhesion sheet(s) such as prepreg or is/are layered on an either side or both sides of the double-sided substrate 7 by the build-up method, to thereby produce a multilayer printed wiring board.

The multilayer printed wiring board thus produced provides a low-profile, light-weight and high-density wiring, and as such can fully meet the needs of the low-profile, light-weight and high-density wiring of the printed wiring board as have been increasingly demanded in recent years.

It should be noted that a sequence of steps for forming the double-sided substrate 7 as mentioned above may be changed as follows. For example, after the insulating resin layer 2 is preformed, the metal foil 1 is laminated to that preformed insulating resin layer 2. Further, after the via holes 3 are formed on that preformed insulating resin layer 2, the insulating resin layer 2 having the preformed via holes 3 and the metal foil 1 are laminated to each other. In addition, the etching of the metal foil 1 may be performed at any time after the insulating resin layer 2 is laminated on the metal foil 1.

EXAMPLES

In the following, the present invention will be described further specifically with reference to Examples and Comparative Examples. The present invention is not in any manner limited to the illustrated Examples and Comparative Examples.

Example 1

Production of Double-Sided Substrate

First, a rolled nickel foil having thickness of 25 $\mu$m (Ni—H available from Toyo Seihaku Co., Ltd.) was cut out to a desired size and was treated with a degreasing agent (50 ml/L-Metaclea CL-5513 available from Dai-ichi Kogyo Seiyaku Co., Ltd.) at 60° C. for 2 minutes. Then, this was washed with water and dried. Through these steps, a nickel foil 11 was prepared, as shown in FIG. 2(a). Then, a photosensitive photovia ink (BL-9700 available from Hitachi Chemical Co., Ltd.) was applied to a single side of the nickel foil 11 by a screen printing with a polyester screen of 200 mesh/inch. Then, this was dried in a dryer of 80° C. for 40 minutes. Through these steps, the insulating resin layer 12 having thickness of about 30 $\mu$m was formed, as shown in FIG. 2(b).

Sequentially, after a film mask was put in close contact with the insulating resin layer 12, it was irradiated with ultraviolet of 2.7 J/cm² from an extra-high pressure mercury vapor lamp. Then, this was heated in the dryer of 110° C. for 20 minutes. Thereafter, it was treated by developing solution (200 g/L-diethylene glycol monobutyl ether, 5 g/L-sodium hydroxide) of 40° C. being sprayed over it at a pressure of 0.12 MPa for 90 seconds and then was washed with water. Then, it was cured in the dryer of 160° C. for 60 minutes. Through these steps, a via hole 13 having a diameter of about 50 µm was formed in the insulating resin layer 12, as shown in FIG. 2(*c*).

Then, the front surface of the insulating resin layer 12 was roughened by desmear agents (MLB-497 available from Meltex, Inc.) of 70° C. for 10 minutes and then was washed with water. Thereafter, it was treated with neutralizing agent of 60° C. (MLB-790 available from Meltex, Inc.) for 5 minutes and then was washed with water. Further, it was treated with plating catalyst (HS-202B available from Hitachi Chemical Co., Ltd.) for 5 minutes to allow the plating catalyst to adhere to the insulating resin layer 12. After having been washed with water, this was treated with activation liquid (ADP-601 available from Hitachi Chemical Co., Ltd.) for 5 minutes. Then, it was washed with water and then dried.

Sequentially, this was treated with 200 ml/L-hydrochlonic acid of 30° C. for 2 minutes. After having been washed with water, it was immersed into electroless nickel plating solution (B-1 available from Meltex, Inc.) of 60° C. for 2 minutes. Then, this was washed with water and then dried. Through these steps, a nickel plated layer 14 having thickness of about 0.1 µm was formed on the front surface of the insulating resin layer 12 and on the exposed surface of the nickel foil 11, as shown in FIG. 2(*d*).

Then, a dry film resist 15 (SPG-152 available from Asahi Chemical Industry Co., Ltd.) was laminated on a front surface of the nickel plated layer 14 at 110° C. Then, after a film mask was put in close contact with the dry film resist, it was irradiated with ultraviolet of 120 mJ/cm² from the extra-high pressure mercury vapor lamp. Thereafter, it was treated by 10 g/L-sodium carbonate of 30° C. being sprayed over it at a pressure of 0.1 MPa for 20 seconds and then was washed with water. Through these steps, the dry film resist 15 was formed in an opposite circuit pattern to a first circuit pattern 16 described below, as shown in FIG. 2(*e*). Thereafter, the copper plating was performed at a current density of 2.5 A/dm² for 20 minutes by using copper sulfate plating solution (additive of 0.2 ml/L-CC-1220 available from Japan Energy Corporation) and thereby the first circuit pattern 16 of about 10 µm in thickness and a conductive layer 29 in the via hole 13 were formed, as shown in FIG. 3(*f*).

Sequentially, this was treated by 30 g/L-sodium hydroxide of 40° C. being sprayed over it at a pressure of 0.1 MPa for 30 seconds, to peel off the dry film resist 15 and then was washed with water, as shown in FIG. 3(*g*). Further, this was treated by nickel peeling solution (Toplip BT available from Okuno Chemical Industries Co., Ltd.) of 40° C. being sprayed over it at a pressure of 0.1 MPa for 10 seconds, to remove the nickel plated layer 14, except the first circuit pattern 16, and then was washed with water and dried, as shown in FIG. 3(*h*).

Then, the dry film resist (SPG-152 available from Asahi Chemical Industry Co., Ltd.) was laminated on a front surface of the nickel foil 11 at 110° C. Then, after the film mask was put in close contact with the dry film resist, it was irradiated with ultraviolet of 120 mJ/cm² from the extra-high pressure mercury vapor lamp. Thereafter, it was treated by 10 g/L-sodium carbonate of 30° C. being sprayed over it at a pressure of 0.1 MPa for 20 seconds and then was washed with water. Through these steps, the dry film resist was formed in an identical circuit pattern to a second circuit pattern 17 described below. Thereafter, this was treated by 42 Baume iron chloride (II) etching solution of 50° C. being sprayed over it at a pressure of 0.1 MPa for 60 seconds and then was washed with water, whereby the nickel foil 11 was etched. Further, this was treated by 30 g/L-sodium carbonate of 40° C. being sprayed over it at a pressure of 0.1 MPa for 30 seconds, to peel off the dry film resist and then was washed with water and dried. Through these steps, the second circuit pattern 17 having thickness of about 25 µm was formed, as shown in FIG. 3(*i*), to thereby produce the double-sided substrate 18 in which the first circuit pattern 16 and the second circuit pattern 17 were electrically connected to each other through the conductive layer 29.

(Production of Multilayer Printed Wiring Board)

One layer was built up on each side of the double-sided substrate 18 to thereby produce a four-layer printed wiring board. Specifically, copper roughening agent (CZ-8100 available from Mec. Co., Ltd.) of 35° C. was sprayed over a front surface of the first circuit pattern 16 at a pressure of 0.1 MPa for 30 seconds, first, and then it was washed with water. Thereafter, this was treated with 350 ml/L-hydrochloric acid of 30° C. at a pressure of 0.1 MPa for 30 seconds and then was washed with water and dried. Through these steps, the front surface of the first circuit pattern 16 was roughened.

Then, the photosensitive photovia ink (BL-9700 available from Hitachi Chemical Co., Ltd.) was applied to the first circuit pattern 16 by the screen printing with a polyester screen of 150 mesh/inch. Then, this was dried in the dryer of 80° C. for 40 minutes. Through these steps, an insulating resin layer 19 having thickness of about 30 µm was formed on the first circuit pattern 16, as shown in FIG. 4(*a*).

Then, the photosensitive photovia ink (BL-9700 available from Hitachi Chemical Co., Ltd.) was applied to the second circuit pattern 17 by the screen printing with a polyester screen of 100 mesh/inch. Then, this was dried in the dryer of 90° C. for 40 minutes. Through these steps, an insulating resin layer 20 having thickness of about 30 µm was formed on the second circuit pattern 17, as shown in FIG. 4(*b*).

Sequentially, after the film masks were put in close contact with the insulating resin layers 19, 20, they were irradiated with ultraviolet of 2.7 J/cm² from the extra-high pressure mercury vapor lamp. Then, these were heated in the dryer of 110° C. for 20 minutes. Thereafter, they were treated by developing solution (200 g/L-diethylene glycol monobutyl ether, 5 g/L-sodium hydroxide) of 40° C. being sprayed over them at a pressure of 0.12 MPa for 90 seconds and then were washed with water. Then, they were cured in the dryer of 160° C. for 60 minutes. Through these steps, via holes 21, 22 were formed in both surfaces of the insulating resin layers 19, 20, as shown in FIG. 4(*c*).

Then, the both surfaces of the insulating resin layers 19, 20 were roughened by the desmear agent (MLB-497 available from Meltex, Inc.) of 70° C. for 10 minutes and then were washed with water. Thereafter, they were treated with the neutralizing agent (MLB-790 available from Meltex, Inc.) of 60° C. for 5 minutes and then were washed with water. Further, they were treated with the plating catalyst (HS-202B available from Hitachi Chemical Co., Ltd.) for 5 minutes to allow the plating catalyst to adhere to the insulating resin layers 19, 20. After having been washed with water, these were treated with activation liquid (ADP- 601 available from Hitachi Chemical Co., Ltd.) for 5 minutes. Then, they were washed with water and then dried.

Sequentially, these were treated with 200 ml/L-hydrochlonic acid of 30° C. for 2 minutes. After having been washed with water, they were immersed into electroless nickel plating solution (B-1 available from Meltex, Inc.) of 60° C. for 2 minutes. Then, these were washed with water and then dried. Through these steps, nickel plated layers 23, 24 having thickness of about 0.1 $\mu$m were formed on the front surfaces of the insulating resin layers 19, 20 and on the exposed surfaces of the first and second circuit patterns 16, 17, as shown in FIG. 4(d).

Then, dry film resists 25, 26 (SPG-152 available from Asahi Chemical Industry Co., Ltd.) were laminated on front surfaces of the nickel plated layers 23, 24 at 110° C. Then, after film masks were put in close contact with the dry film resists, they were irradiated with ultraviolet of 120 mJ/cm$^2$ from the extra-high pressure mercury vapor lamp. Thereafter, these were treated by 10 g/L-sodium carbonate of 30° C. being sprayed over them at a pressure of 0.1 MPa for 20 seconds and then was washed with water. Through these steps, the dry film resists 25, 26 were formed in opposite circuit patterns to third and fourth circuit patterns 27, 28 described below, as shown in FIG. 5(e). Thereafter, the copper plating was performed at a current density of 2.5 A/dm$^2$ for 20 minutes by using the copper sulfate plating solution (additive of 0.2 ml/L-CC-1220 available from Japan Energy Corporation) and thereby the third and fourth circuit patterns 27, 28 of about 10 $\mu$m in thickness and conductive layers 30, 33 in the via holes 21, 22 were formed, as shown in FIG. 5(f).

Sequentially, these were treated by 30 g/L-sodium hydroxide of 40° C. being sprayed over them at a pressure of 0.1 MPa for 30 seconds, to peel off the dry film resists 25, 26 and then were washed with water, as shown in FIG. 5(g). Further, these were treated by nickel peeling solution (Toplip BT available from Okuno Chemical Industries Co., Ltd.) of 40° C. being sprayed over them at a pressure of 0.1 MPa for 10 seconds, to remove the nickel plated layers 23, 24, except the third and fourth circuit patterns 27, 28, and then were washed with water and dried. Through these steps, the four-layer printed wiring board was produced, as shown in FIG. 5(h).

Example 2

(Production of Double-Sided Substrate)

First, a rolled copper alloy foil having thickness of 35 $\mu$m (C-7025 available from Yamaha-Olin Metal Corporation) was cut out to a desired size and was treated with a degreasing agent (200 ml/L-OPC Acid clean 115 available from Okuno Chemical Industries Co., Ltd.) at 60° C. for 2 minutes. Then, it was washed with water and dried. Through these steps, a copper alloy foil 31 was prepared, as shown in FIG. 6(a).

Then, the copper alloy foil 31 was immersed into 100 ml/L-hydrochlonic acid of 30° C. for 20 seconds and then was immersed into palladium-substituted plating solution (200 ml/L-ICP Accela available from Okuno Chemical Industries Co., Ltd.) of 30° C. for 3 minutes. Then, it was washed with water. Further, this was immersed into the electroless nickel plating solution (B-1 available from Meltex, Inc.) of 60° C. for 2 minutes, and then it was washed with water and dried. Through these steps, a nickel plated layer 32 having thickness of about 0.1 $\mu$m was formed on a single side of the copper alloy foil 31, as shown in FIG. 6(b).

Then, polyamic acid resin solution of the composition shown below was applied to the front surface of the nickel plated layer 32 of the copper alloy foil 31 by use of a spin coater. Then, it was dried in the dryer of 100° C. for 15 minutes and then was cured in the dryer under nitrogen gas atmosphere of 400° C. for 1 hour. Through these steps, an insulating resin layer 34 having thickness of about 10 $\mu$m was formed, as shown in FIG. 6(c).

| Composition of polyamic acid resin | | |
|---|---|---|
| Anhydride: | 3,3',4,4'-biphenyltetracarboxylic acid | 5 parts by weight |
| Diamine: | p-phenylenediamine | 5 parts by weight |
| Solvent: | N-methyl-2-pyrrolidone | 28 parts by weight |

Sequentially, via holes 35 having a diameter of about 50 $\mu$m were formed in the insulating resin layer 34 by use of a laser drilling device (MODEL 5200 available from ESI Corporation) in the conditions of frequency of 4 kHz, output power of 700 mW, and 50 shots/hole, as shown in FIG. 6(d).

Then, by using a sputtering device (SMH-2306RE MH60-5210 available from ULVAC), a chrome sputter deposit 36 having thickness of about 0.03 $\mu$m was formed in the conditions of argon gas and RF power of 400 W and, sequentially, a copper sputter deposit 37 having thickness of about 0.1 $\mu$m was formed in the conditions of argon gas and RF power of 300 W, as shown in FIG. 6(e).

Then, this was immersed into 100 ml/L-sulfuric acid of 25° C. for 20 seconds and then was washed with water. Thereafter, the copper plating was performed at a current density of 2 A/dm$^2$ for 30 minutes by using via filling copper plating solution (additive of 20 ml/L-Cubelite VF-MU available from Ebara-Udylite Co., Ltd.) and thereby a copper plated layer 38 was formed on the copper sputter deposit 37, as shown in FIG. 7(f). After having being washed with water, it was dried in the dryer 100° C. for 30 minutes.

Then, a dry film resist 39 (SPG-152 available from Asahi Chemical Industry Co., Ltd.) was laminated on a front surface of the copper plated layer 38 at 110° C. Then, after a film mask was put in close contact with the dry film resist, it was irradiated with ultraviolet of 120 mJ/cm$^2$ from the extra-high pressure mercury vapor lamp. Thereafter, it was treated by 10 g/L-sodium carbonate of 30° C. being sprayed over it at a pressure of 0.1 MPa for 20 seconds and then was washed with water. Through these steps, the dry film resist 39 was formed in an identical circuit pattern to a first circuit pattern 40 described below, as shown in FIG. 7(g). Thereafter, 42 Baume iron chloride (II) etching solution of 50° C. were sprayed at a pressure of 0.1 MPa for 60 seconds, whereby the copper plated layer 38 and the copper sputter deposit 37 were etched. Further, this was immersed into 12.5 weight % hydrochloric acid of 50° C. for 2 minutes, whereby the chrome sputter deposit 36 was etched. Through these steps, the first circuit pattern 40 of about 10 $\mu$m in thickness and a conductive layer 43 in the via hole 35 were formed, as shown in FIG. 7(h). Further, this was treated by 30 g/L-sodium hydroxide of 40° C. being sprayed over it at a pressure of 0.1 MPa for 30 seconds, to peel off the dry film resist 39 and then was washed with water, as shown in FIG. 7(i).

Then, the dry film resist (SPG-152 available from Asahi Chemical Industry Co., Ltd.) was laminated on a front surface of the copper alloy foil 31 at 110° C. Then, after the film mask was put in close contact with the dry film resist, it was irradiated with ultraviolet of 120 mJ/cm$^2$ from the extra-high pressure mercury vapor lamp. Thereafter, it was treated by 10 g/L-sodium carbonate of 30° C. being sprayed over it at a pressure of 0.1 MPa for 20 seconds and then was washed with water. Through these steps, the dry film resist was formed in an identical circuit pattern to a second circuit pattern 41 described below. Thereafter, this was treated by 42 Baume iron chloride (II) etching solution of 50° C. being sprayed over it at a pressure of 0.1 MPa for 90 seconds and then was washed with water, whereby the copper alloy foil 31 was etched. Further, this was treated by 30 g/L-sodium hydroxide of 40° C. being sprayed over it at a pressure of 0.1 MPa for 30 seconds, to peel off the dry film resist and then was washed with water and dried. Through these steps, the second circuit pattern 41 having thickness of about 10 μm was formed, as shown in FIG. 7(j), to thereby produce a double-sided substrate 42 in which the first circuit pattern 40 and the second circuit pattern 41 were electrically connected to each other through the conductive layer 43.

(Production of Multilayer Printed Wiring Board)

Two double-sided substrates 42 thus produced, which were different in circuit pattern from each other, were laminated and adhesive bonded to each other to thereby produce a four-layer printed wiring board. Specifically, two double-sided substrates 42 (one of them has the same circuit pattern as the double-sided substrate 18 formed thereon) were prepared. They were immersed into the copper roughening solution (200 g/L-ammonium persulfate) of 30° C. for 1 minute and then washed with water and dried. Through these steps, the front surface of the first circuit pattern 40 and the front surface of the second circuit pattern 41 were roughened.

Sequentially, the two double-sided substrates 42 were laminated and bonded to each other via polyimide resin adhesive 44 (SPB-050A available from Nippon Steel Chemical Co., Ltd.) sandwiched there between for 60 minutes in the conditions of 200° C. and 3 MPa by use of a vacuum press, to thereby produce the four-layer printed wiring board as shown in FIG. 8(b).

Example 3

Except that in place of the rolled nickel foil having thickness of 25 μm (Ni—H available from Toyo Seihaku Co., Ltd.), a rolled SUS304 foil having thickness of 25 μm (SUS304H-TA available from Toyo Seihaku Co., Ltd.) was used as the metal foil, a double-sided substrate was produced in the same manner as in EXAMPLE 1 and then a four-layer printed wiring board was produced by use of the double-sided substrate in the same manner as in EXAMPLE 1.

Example 4

Except that in place of the rolled nickel foil having thickness of 25 μm (Ni—H available from Toyo Seihaku Co., Ltd.), a rolled 42 alloy foil having thickness of 25 μm (D-1 available from Sumitomo Special Metals Co., Ltd.) was used as the metal foil, a double-sided substrate was produced in the same manner as in EXAMPLE 1 and then a four-layer printed wiring board was produced by use of the double-sided substrate in the same manner as in EXAMPLE 1.

Example 5

A rolled SUS430 foil having thickness of 25 μm (SUS430H available from Toyo Seihaku Co., Ltd.) was cut to a desired size. Then, it was treated with a degreasing agent (50 ml/L-Metaclea CL-5513 available from Dai-ichi Kogyo Seiyaku Co., Ltd.) at 60° C. for 2 minutes and then washed with water and dried to prepare a SUS430 foil. Sequentially, a double-sided substrate was produced in the same manner as in EXAMPLE 2 and then a four-layer printed wiring board was produced by use of the double-sided substrate in the same manner as in EXAMPLE 2.

Example 6

Except that in place of the rolled SUS430 foil having thickness of 25 μm (SUS430H available from Toyo Seihaku Co., Ltd.), a rolled 36 alloy foil having thickness of 25 μm (I available from Sumitomo Special Metals Co., Ltd.) was used as the metal foil, a double-sided substrate was produced in the same manner as in EXAMPLE 5 and then a four-layer printed wiring board was produced by use of the double-sided substrate in the same manner as in EXAMPLE 5.

Comparative Example 1

A glass-epoxy laminated sheet 51 of about 0.13 mm in thickness having the copper foil 57 of 18 μm adhesive bonded to each side thereof (MCL-679 available from Hitachi Chemical Co., Ltd.) was cut out to a desired size and, then, through holes 52 were formed in the laminated sheet 51 with a hard drill of 0.15 mm in diameter, as shown in FIG. 9(a).

Then, it was treated with a degreasing agent (200 ml/L-OPC Acid clean 115 available from Okuno Chemical Industries Co., Ltd.) of 60° C. for 2 minutes and was washed with water. Thereafter, this was immersed into copper roughening solution (200 g/L-ammonium persulfate) of 30° C. for 1 minute and then was washed with water. Then, it was treated with plating catalyst (HS-202B available from Hitachi Chemical Co., Ltd.) for 5 minutes and was washed with water. Thereafter, it was treated with activation solution (ADP-601 available from Hitachi Chemical Co., Ltd.) for 5 minutes and then was washed with water.

Sequentially, this was immersed into the electroless copper plating solution (CUST-2000 available from Hitachi Chemical Co., Ltd.) of 40° C. for 5 minutes, to form a copper plated layer having thickness of about 0.1 μm (not shown) on inner walls of the through holes 52 and the front surface of the copper foil 57 and then was washed with water.

Further, the copper plating was performed at a current density of 2.5 A/dm$^2$ for 20 minutes by using copper sulfate plating solution (additive of 0.2 ml/L-CC-1220 available from Japan Energy Corporation) and then was washed with water and dried. Through these steps, the copper plated layer 53 was formed and the through holes 52 were made to be conductive, as shown in FIG. 9(b).

Subsequently, the dry film resist (SPG-152 available from Asahi Chemical Industry Co., Ltd.) was laminated on each side of the copper plated layer at 110° C. Then, after the film mask was put in close contact with the dry film resist, it was irradiated with ultraviolet of 120 mJ/cm$^2$ from the extra-high pressure mercury vapor lamp. Thereafter, it was treated by 10 g/L-sodium carbonate of 30° C. being sprayed over it at a pressure of 0.1 MPa for 20 seconds and then was washed with water. Through these steps, the dry film resist was formed in an identical circuit pattern to an intended circuit pattern. Thereafter, this was treated by 42 Baume iron chloride (II) etching solution of 50° C. being sprayed over it at a pressure of 0.1 MPa for 60 seconds and then was washed with water, whereby the copper plated layer 53 and the copper foil 57 were etched. Further, this was treated by 30 g/L-sodium hydroxide of 40° C. being sprayed over it at a pressure of 0.1 MPa for 30 seconds, to peel off the dry film resist and then was washed with water and dried. Through these steps, the double-sided substrate 54 having the circuit pattern of about 26 μm in thickness was produced, as shown in FIG. 9(c).

Evaluation

The double-sided substrates of the Examples 1–6 and Comparative Example 1 are about 120 mm long and about 100 mm wide in size and all of them have the same circuit patterns formed thereon.

By comparison of the weights of these double-sided substrates, it was found that the double-sided substrate of Comparative Example 1 weighed about 4.6 g, whereas the double-sided substrates of Examples 1, 2, 3, 4, 5 and 6 weighed about 2.9 g, 3.1 g, 3.0 g, 3.0 g, 3.1 g and 3.2 g respectively, so that the weights of the double-sided substrate of these Examples reduced about 35% over that of Comparative Example 1.

By comparison of the thickness of these double-sided substrates, it was found that the thickness of the double-sided substrate of Comparative Example 1 was about 152 $\mu$m, whereas those of the double-sided substrates of Examples 1, 2, 3, 4, 5 and 6 were about 64 $\mu$m, 53 $\mu$m, 64 $\mu$m, 64 $\mu$m, 52 $\mu$m and 53 $\mu$m respectively, so that the thickness of the double-sided substrate of these Examples reduced 50% or more over that of Comparative Example 1.

It can be seen from this that a demanded light-weight and low-profile multilayer printed wiring board can be produced when the double-sided substrate produced by the multilayer printed wiring board producing method of the present invention is used as the core substrate and the printed wiring(s) is/are layered on each side of the core substrate in the laminate-en-bloc method or in the build-up method.

In addition, in the double-sided substrate of Comparative Example 1, the electrical connection between the circuit patterns formed on opposite sides of the double-sided substrate is provided through the through holes 52 of about 150 $\mu$m in diameter, whereas in the double-sided substrates of Examples 1–6, the electrical connection therebetween is provided through the via holes of about 50 $\mu$m in diameter. Thus, in the double-sided substrates of Examples 1–6, the holes for permitting the circuit patterns formed on the opposite sides of the substrate to be conductive can be reduced in diameter. This can permit the via hole pad to reduce in diameter and thus can provide a high-density wiring.

It is to be noted that the illustrative examples of the present invention provided in the above description are for illustrative purpose only and it is not to be construed restrictively. Modification and variation of the present invention that will be obvious to those skilled in the art is to be covered in the following claims.

What is claimed is:

1. A method of producing a multilayer printed wiring board comprising:
    a step of forming an insulating resin layer on a single side of a metal foil;
    a step of forming a via hole only in the insulating resin layer;
    a step of forming a resist on the insulating resin layer in a reverse pattern of a first specified circuit pattern;
    a step of forming the first specified circuit pattern on the insulating resin layer and, at the same time, forming a conductive layer in the via hole, by plating to allow the metal foil and the circuit pattern to be electrically conductive through the conductive layer;
    a step of removing the resist on the insulating resin layer; and
    a step of etching the metal foil to form it into a second specified circuit pattern.

2. The method of producing a multilayer printed wiring board according to claim 1, wherein the metal foil is made of any of copper or copper alloy containing copper as its primary component, nickel or nickel alloy containing nickel as its primary component, alloy containing nickel and iron as its primary components, and stainless steel.

3. The method of producing a multilayer printed wiring board according to claim 1, wherein the insulating resin layer comprises polyimide.

* * * * *